United States Patent
Hwang

(10) Patent No.: US 7,589,359 B1
(45) Date of Patent: Sep. 15, 2009

(54) SILICON CONTROLLED RECTIFIER

(75) Inventor: Hsin-Yen Hwang, Hsinchu County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 12/179,858

(22) Filed: Jul. 25, 2008

(51) Int. Cl.
*H01L 29/32* (2006.01)
*H01L 29/74* (2006.01)
*H01L 31/111* (2006.01)
*H01L 29/423* (2006.01)
*H01L 29/43* (2006.01)
*H01L 29/47* (2006.01)
*H01L 29/49* (2006.01)
*H01L 29/167* (2006.01)
*H01L 29/207* (2006.01)
*H01L 29/227* (2006.01)
*H01L 31/0288* (2006.01)

(52) U.S. Cl. .................. 257/107; 257/124; 257/142; 257/148; 257/156; 257/608; 257/612; 257/E29.181; 257/E29.211

(58) Field of Classification Search .......... 257/107, 257/124, 142, 148, 156, 608, 612, E29.181, 257/E29.211
See application file for complete search history.

(56) References Cited

U.S. PATENT DOCUMENTS

| | | | | |
|---|---|---|---|---|
| 5,847,440 A * | 12/1998 | Yamamoto | ............... | 257/525 |
| 5,998,843 A * | 12/1999 | Yoshida | ............... | 257/370 |
| 6,060,752 A * | 5/2000 | Williams | ............... | 257/355 |
| 6,365,924 B1 | 4/2002 | Wang et al. | | |
| 6,512,662 B1 | 1/2003 | Wang | | |
| 6,531,363 B2 * | 3/2003 | Uchida | ............... | 438/275 |
| 6,610,578 B2 * | 8/2003 | Norstrom et al. | ............... | 438/369 |
| 6,635,931 B1 | 10/2003 | Wang | | |
| 7,271,442 B2 * | 9/2007 | Yang et al. | ............... | 257/338 |
| 7,411,271 B1 * | 8/2008 | Ma et al. | ............... | 257/547 |
| 2002/0074604 A1 | 6/2002 | Wang et al. | | |
| 2006/0022278 A1* | 2/2006 | Pan et al. | ............... | 257/369 |
| 2006/0148188 A1* | 7/2006 | Liu et al. | ............... | 438/329 |
| 2007/0075363 A1* | 4/2007 | Otake et al. | ............... | 257/335 |
| 2007/0134854 A1* | 6/2007 | Zhang et al. | ............... | 438/142 |
| 2007/0158754 A1* | 7/2007 | Soma et al. | ............... | 257/370 |
| 2008/0150083 A1* | 6/2008 | Soma et al. | ............... | 257/587 |

* cited by examiner

*Primary Examiner*—Ida M Soward
(74) *Attorney, Agent, or Firm*—Winston Hsu

(57) ABSTRACT

A silicon controlled rectifier structure with the symmetrical layout is provided. The N-type doped regions and the P-type doped regions are disposed with the N-well and symmetrically arranged relative to the isolation structure in-between, while the P-type buried layer is located under the N-type doped regions and the P-type doped regions and fully isolates the N-type doped regions from the N-well.

11 Claims, 4 Drawing Sheets

SILICON CONTROLLED RECTIFIER

BACKGROUND OF THE INVENTION

1. Field of the Invention

This invention generally relates to a semiconductor device, and more particularly to a silicon controlled rectifier (SCR) for electrostatic discharge (ESD) protection.

2. Description of Related Art

Semiconductor integrated circuits (ICs) or devices are normally designed with at least an additional protection structure or circuit to provide a discharge path for the additional current caused during high-amplitude electrostatic discharge (ESD) pulses, which can effectively prevent damages to the device or the IC. ESD protection circuits or devices are usually located between the input/output (I/O) pads (or pins) and ground (or power rail). Moreover, ESD protection devices can be incorporated into the MOS circuits on the chip.

The silicon controlled rectifier (SCR) devices have been proposed to serve as the ESD protection device due to its relatively high ESD level and small layout area. The SCR device is made up of four semiconductor layers arranged as P-N-P-N and can be considered as one PNP transistor and one NPN transistor working together. As an ESD stress having a voltage higher than the triggered point (or the turn-on voltage) is applied to the anode, the SCR device becomes conductive and permits the majority of the ESD current to bypass, thus enhancing the ESD tolerance of the circuits.

In principle, when the semiconductor device is in normal operation, the ESD protection structure should not be activated unexpectedly. For the semiconductor device having a dual polarity input/output (I/O) pad, the detection of the static electricity can be classified into a positive polarity situation and a negative polarity situation. However, as the pn junction of the existent ESD protection structure is only capable of forming a forward-bias diode, the semiconductor device will not be satisfactorily protected under the negative polarity situation.

Therefore, the ESD protection device or circuits should be designed to protect the semiconductor device against any electro-static current regardless of whether the electro-static current is a positive electro-static current or a negative electro-static current.

SUMMARY OF THE INVENTION

The present invention provides a SCR (silicon controlled rectifier) structure, which can ensure adequate ESD protection without compromising performance of the circuits. The design of the SCR structure in the present invention is symmetrical and the SCR structure provides the same level of ESD protection in both supply directions. Due to its compact design, the SCR structure in the present invention affords high levels of ESD robustness.

The present invention provides a silicon controlled rectifier (SCR) structure comprising a substrate with at least an N-well and a plurality of isolation structures, at least two P-type doped regions and at least two N-type doped regions located in the N-well, and at least two P-type buried layers located within the N-well.

In one embodiment of the present invention, the SCR structure includes a P-type substrate having at least an N-well, a first isolation structure, a second isolation structure and a third isolation structure between the first and second isolation structures, a first P-type doped region, a first N-type doped region and a first P-type buried layer located within the N-well and between the first and third isolation structures, and a second P-type doped region, a second N-type doped region and a second P-type buried layer located within the N-well and between the second and third isolation structures. The SCR structure the first and second N-type doped regions are disposed in the P-type substrate at both sides of the third isolation structure, and the first and second P-type doped regions are respectively disposed besides the first and second N-type doped regions.

In an embodiment of the present invention, for the SCR structure, the first and second N-type doped regions are respectively adjoined with the first and second P-type doped regions.

In an embodiment of the present invention, for the SCR structure, the first and second N-type doped regions are respectively separate from the first and second P-type doped regions. A plurality of salicide blocks are disposed on the surface of the substrate and respectively disposed between the N-type doped and P-type doped regions.

According to the embodiments of the present invention, the first and second P-type buried layers may be disposed under the first and second N-type doped regions, and completely isolate the first and second N-type doped regions from the N-well, respectively.

According to the embodiments of the present invention, the first and second P-type buried layer may completely isolate the first and second P-type doped regions from the N-well.

The SCR structure according to the embodiments of the present invention affords better ESD discharge capacity with bi-directional current paths. Due to the symmetric design, the SCR structure has smaller device sizes for dual-directional ESD protection. Furthermore, the parasitic capacitance of the ESD protection device can be effectively reduced with smaller device sizes. The structure of the present invention may be suitably applied for on-chip ESD protection for the I/O pins of general-purpose circuits or for high-speed applications. In addition, the structure described in the embodiments can be concurrently fabricated or formed by the same steps of the CMOS processes.

One or part or all of these and other features and advantages of the present invention will become readily apparent to those skilled in this art from the following description wherein there is shown and described a preferred embodiment of this invention, simply by way of illustration of one of the modes best suited to carry out the invention. As it will be realized, the invention is capable of different embodiments, and its several details are capable of modifications in various, obvious aspects all without departing from the invention. Accordingly, the drawings and descriptions will be regarded as illustrative in nature and not as restrictive.

DESCRIPTION OF THE PREFERRED EMBODIMENTS

The present invention discloses a silicon controlled rectifier (SCR) structure serving as an ESD protection device. In the following embodiments, the SCR structure can be incorporated or embedded into the MOS or CMOS circuits and the manufacture of the SCR structure is compatible with the CMOS processes. The protection device or circuit described in this invention would not be activated under the normal bias level lower than the threshold of the device. However, when a positive or negative electro-static current attacks the device, the ESD protection device or circuit of the present invention will be activated. The embodiments described below are for the demonstration of the present invention, and do not intend to limit to the scope of the present invention.

Figure 1:
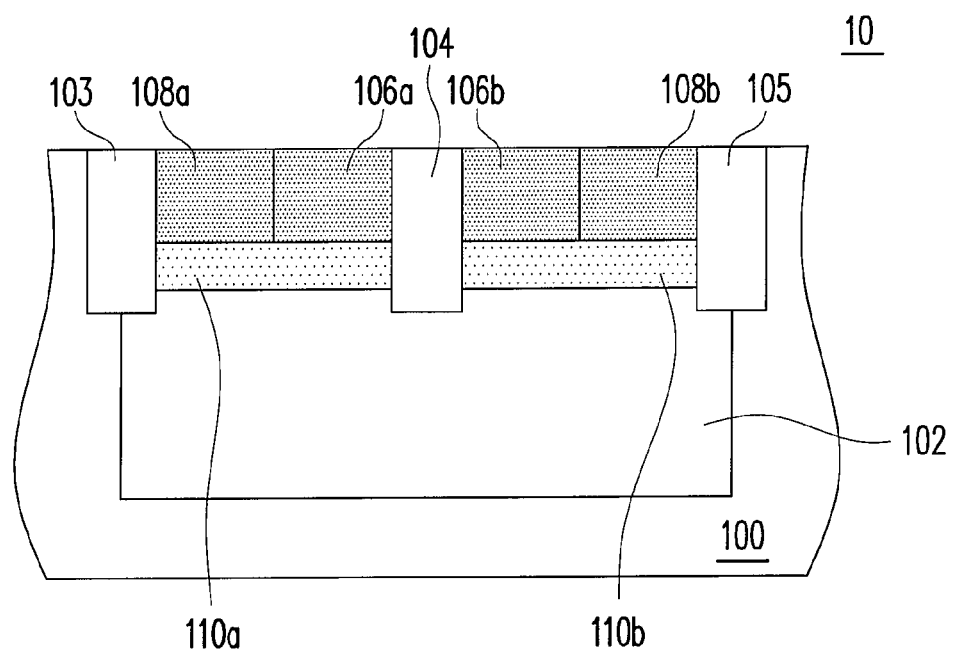
FIG. 1 shows a cross-sectional view of a SCR structure according to one preferred embodiment of this invention.

FIG. 1 shows a cross-sectional view of a SCR structure according to one preferred embodiment of this invention. In FIG. 1, the SCR structure 10 includes a P-type substrate 100 with at least an N-well region 102 and a plurality of isolation structures 103, 104 and 105 formed therein. Between two adjacent isolation structures 103 & 104, one N-type doped region 106a and one P-type doped region 108a are formed within the N-well region 102, while a P-type buried layer 110a is disposed under the N-type doped region 106a and the P-type doped region 108a and within the N-well region 102. Between two adjacent isolation structures 105 & 104, one N-type doped region 106b and one P-type doped region 108b are formed within the N-well region 102, while a P-type buried layer 110b is disposed under the N-type doped region 106b and the P-type doped region 108b and within the N-well region 102.

As the design of the SCR structure is symmetric, the two N-type doped regions 106a, 106b are disposed in the substrate 100 at both sides of the central isolation structure 104, while the two P-type doped regions 108a, 108b are respectively disposed besides the two N-type doped regions 106a, 106b. As shown in FIG. 1, one side of each N-type doped region 106a/106b adjoins with the isolation structure 104, while the other side of each N-type doped region 106a/106b adjoins with the P-type doped region 108a/108b. The P-type buried layers 110a, 110b entirely isolate the P-type doped regions 108a, 108b and the N-type doped regions 106a, 106b from the N-well region 102.

Figure 3A:
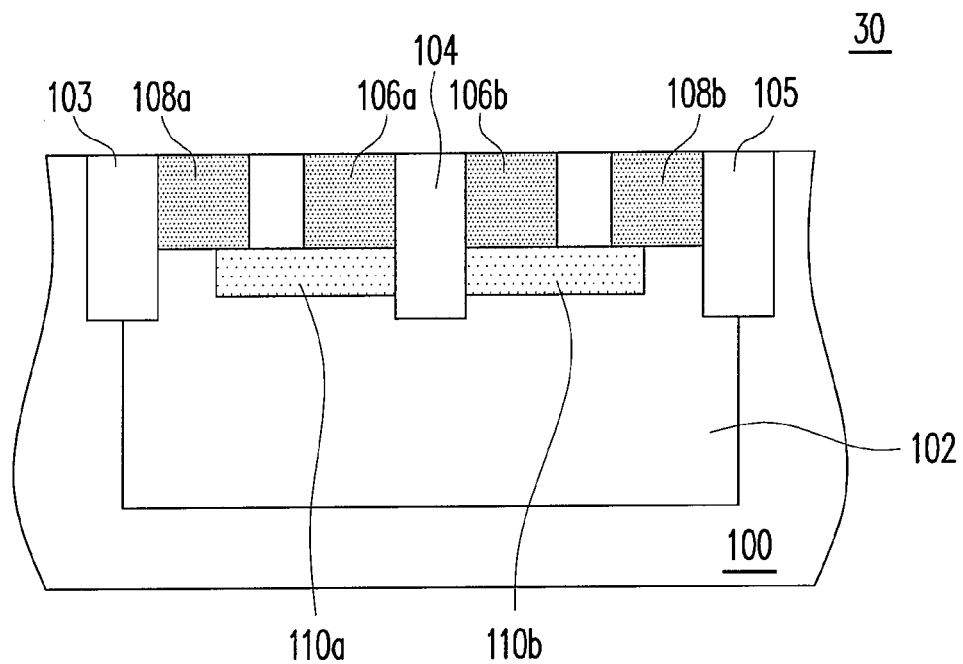
FIG. 3A shows a cross-sectional view of a SCR structure according to another preferred embodiment of this invention.

Alternatively, according to another embodiment as shown in FIG. 3A, the SCR structure 30 is similar to the structure shown in FIG. 1, except that the two P-type doped regions 108a, 108b are not connected to (i.e. separated from) the two N-type doped regions 106a, 106b. That is, one side of each N-type doped region 106a/106b adjoins with the isolation structure 104, but the other side of each N-type doped region 106a/106b does not adjoin with the P-type doped region 108a/108b. However, one side of each P-type doped region 108a/108b adjoins with the adjacent isolation structure 103/105. In addition, the P-type buried layers 110a, 110b entirely isolate the corresponding N-type doped regions 106a, 106b from the N-well region 102, but only partially cover the P-type doped regions 108a, 108b. Hence, the P-type doped regions 108a, 108b are partially connected to the N-well region 102.

Figure 3B:
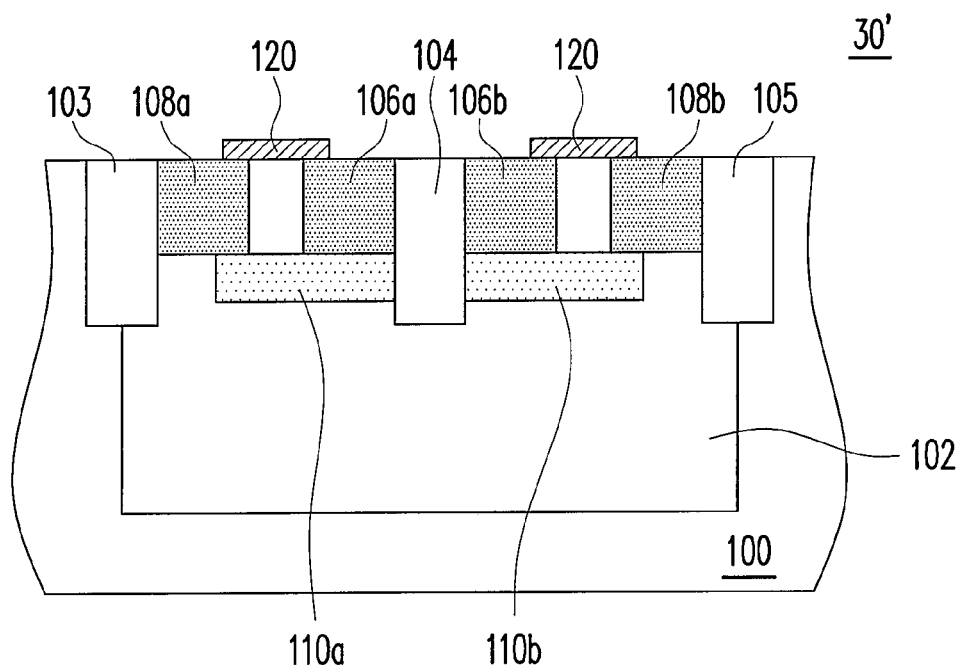
FIG. 3B shows a cross-sectional view of a SCR structure according to another preferred embodiment of this invention.

On the other hand, according to another embodiment as shown in FIG. 3B, the SCR structure 30' is similar to the structure shown in FIG. 3A, except that salicide blocks 120 are further included. The salicide blocks 120 are disposed on the surface of the substrate 100, between the isolation structures 103/104 or 104/105, and above the P-type doped regions 108a/108b and the N-type doped regions 106a/106b. In principle, the salicide blocks 120 cover the space (unconnected region) between the P-type doped regions 108a/108b and the N-type doped regions 106a/106b.

According to the previously described structures, the N-type doped region 106a/106b can be a heavily doped N$^+$ region, while the P-type doped region 108a/108b can be a heavily doped P$^+$ region, for example. The doping concentration of the P-type buried layers 110a, 110b can be lower or about the same as that of the P-type doped region 108a/108b, for example.

Figure 2:
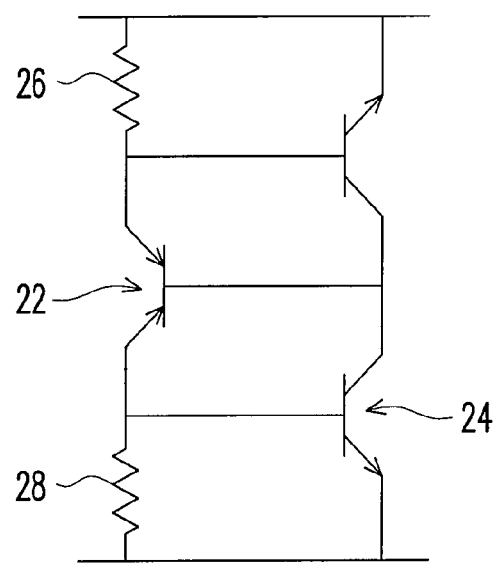
FIG. 2 shows a circuit schematic diagram of the SCR structure of this invention.

FIG. 2 shows a circuit schematic diagram of the SCR structure of this invention. Referring to both FIGS. 1 and 2, the p-type buried layer 110a, the N-well region 102 and the p-type buried layer 110b of FIG. 1 are respectively the emitter, base and collector of the p-n-p parasitic bipolar junction transistor 22. The N-well region 102, the p-type buried layer 110b and the N-type doped region 106b respectively form the emitter, base and collector of an n-p-n parasitic bipolar junction transistor 24. The resistor 26 represents the resistance of the P-type doped region 108a disposed between the N-type doped region 106a and the P-type buried layer 110a, while the resistor 28 represents the resistance of the P-type doped region 108b disposed between the N-type doped region 106b and the P-type buried layer 110b. The resistance of the resistors can be adjusted to change the holding voltage or the turn-on voltage of the SCR structure in relation to the device or circuit design.

Figure 4:
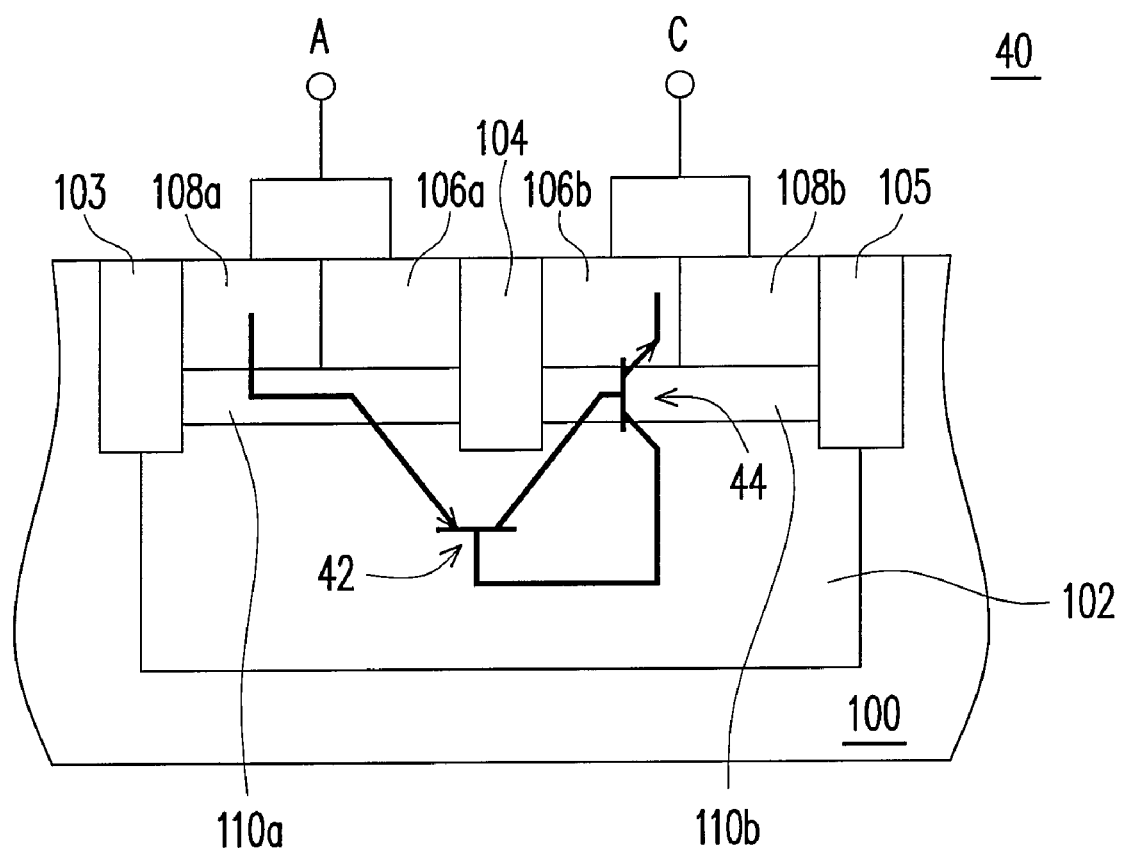
FIG. 4 schematically illustrating the SCR current path of the SCR structure during ESD pulses according to one preferred embodiment of this invention.

FIG. 4 shows the current path superimposed on the cross-sectional view of the SCR structure, for understanding the ESD operation of the SCR structure. Referring to FIG. 4, in the SCR structure 40 of the present invention, a p-n-p parasitic bipolar junction transistor 42 is formed by the p-type buried layer 110a, the N-well region 102 and the p-type buried layer 110b. Moreover, the N-well region 102, the p-type buried layer 110b and the N-type doped region 106b also form an n-p-n parasitic bipolar junction transistor 44. When a positive pulse is applied across the terminals A and C (e.g. a positive bias is applied to terminal A and terminal C is grounded), the positive electro-static current enters from the terminal A into the p-type buried layer 110a, the positive electro-static current may flow through the N-well region 102 and then to the p-type buried layer 110b. Thereafter, the electro-static current will flow to the N-type doped region 106b and exits through the terminal C.

The ESD operation of the SCR structure 40 when a negative pulse is applied across terminals A and C can be easily understood due to the symmetrical design of the SCR structure of this invention.

Figure 5:
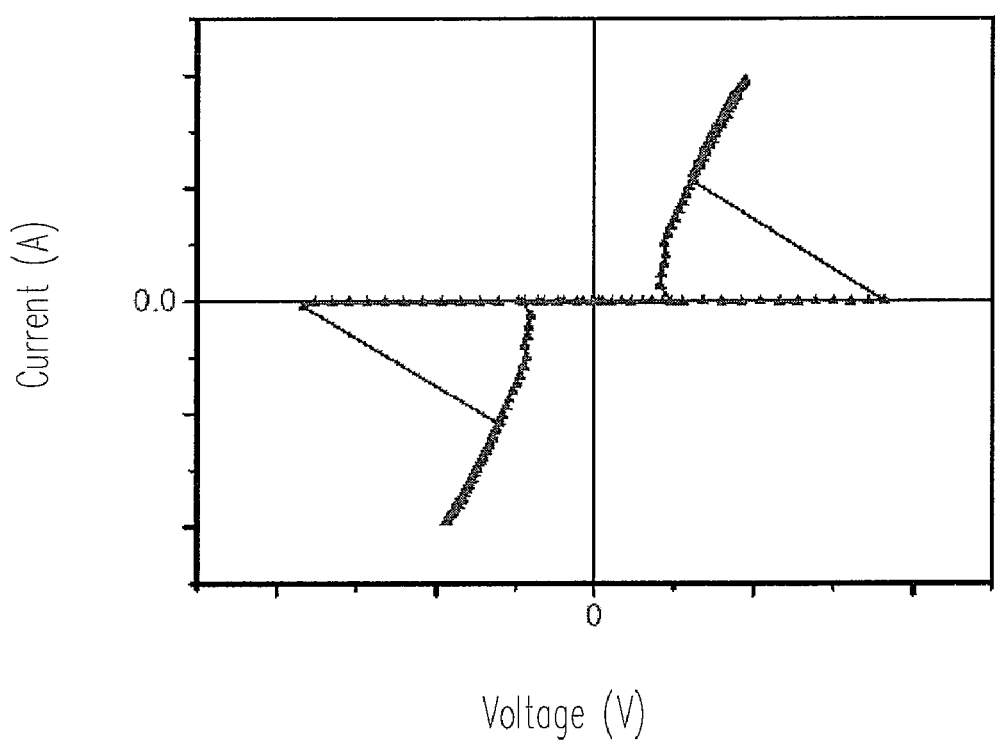
FIG. 5 shows is a plot of current vs. voltage (I-V curve) of the SCR structure according to one preferred embodiment of this invention.

Referring to FIG. 5, the current-voltage characteristic (I-V curve) of the SCR structure for the dual ESD polarity situation is shown. As shown in FIG. 5, the current-voltage characteristics (I-V curve) of the SCR structure under a positive electro-static discharge pulses or a negative electro-static discharge pulses across two terminals, are symmetrical. It indicates that the formed p-n-p-n silicon control rectifier (SCR) structure during when attacked by the electro-static currents from two directions (i.e. from terminal A or terminal C) are symmetrical. Therefore, it proves that the SCR structure of this invention can be triggered dual-directionally as the ESD protection device for protection.

For the fabrication of the SCR structure being compatible with the CMOS processes, the N-well region 102 can be formed from the steps of forming the N-well for PMOS (i.e.

N-well mask), for example. Similarly, the N-type doped region 106a/106b can be formed during forming the source/drain of NMOS, while the P-type doped region 108a/108b can be formed during forming the source/drain of PMOS. The manufacturing processes for forming the afore-mentioned SCR structures are in general compatible with the processes of CMOS technology, but extra process steps or parameter modifications can be further applied depending on the layout requirements.

The SCR structure described above can discharge ESD currents evenly in two directions due to its symmetrical layout. Moreover, the compact layout of the SCR structure affords smaller device sizes under the same ESD robustness. Furthermore, the parasitic capacitance of the ESD protection device can be effectively reduced with smaller device sizes.

The foregoing description of the preferred embodiment of the present invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A silicon controlled rectifier structure, comprising:
   a P-type substrate having at least an N-well and a plurality of isolation structures therein, wherein the isolation structures comprises a first isolation structure, a second isolation structure and a third isolation structure between the first and second isolation structures;
   a first P-type doped region, a first N-type doped region and a first P-type buried layer located within the N-well and between the first and third isolation structures; and
   a second P-type doped region, a second N-type doped region and a second P-type buried layer located within the N-well and between the second and third isolation structures.

2. The structure of claim 1, wherein the first and second N-type doped regions are disposed in the P-type substrate at both sides of the third isolation structure, and the first and second P-type doped regions are respectively disposed besides the first and second N-type doped regions.

3. The structure of claim 2, wherein the first N-type doped region is adjoined with the first P-type doped region, while the second N-type doped region is adjoined with the second P-type doped region.

4. The structure of claim 2, wherein the first N-type doped region is separate from the first P-type doped region, while the second N-type doped region is separate from the second P-type doped region.

5. The structure of claim 2, wherein the first P-type buried layer is disposed under the first P-type doped region and the first N-type doped region, while the second P-type buried layer is disposed under the second P-type doped region and the second N-type doped region.

6. The structure of claim 5, wherein the first P-type buried layer completely isolates the first N-type doped region from the N-well, while the second P-type buried layer completely isolates the second N-type doped region from the N-well.

7. The structure of claim 5, wherein the first P-type buried layer completely isolates the first P-type doped region and the first N-type doped region from the N-well, while the second P-type buried layer completely isolates the second P-type doped region and the second N-type doped region from the N-well.

8. The structure of claim 2, one side of the first P-type doped region is adjoined with the first isolation structure, while one side of the second P-type doped region is adjoined with the second isolation structure.

9. The structure of claim 1, wherein the first and second N-type doped regions are heavily doped N+ regions.

10. The structure of claim 1, wherein the first and second P-type doped regions are heavily doped P+ regions.

11. The structure of claim 4, further comprising a first and a second salicide blocks disposed on the P-type substrate, wherein the first salicide block is disposed above the first N-type doped region and the first P-type doped region, while the second salicide block is disposed above the second N-type doped region and second P-type doped region.

* * * * *